United States Patent
Khalil et al.

(10) Patent No.: US 10,615,510 B1
(45) Date of Patent: Apr. 7, 2020

(54) FEED STRUCTURE, ELECTRICAL COMPONENT INCLUDING THE FEED STRUCTURE, AND MODULE

(71) Applicant: NXP USA, Inc., Austin, TX (US)

(72) Inventors: Ibrahim Khalil, Gilbert, AZ (US); Hussain Hasanali Ladhani, Tempe, AZ (US); Henry Andre Christange, Egmating (DE)

(73) Assignee: NXP USA, Inc., Austin, TX (US)

( * ) Notice: Subject to any disclaimer, the term of this patent is extended or adjusted under 35 U.S.C. 154(b) by 60 days.

(21) Appl. No.: 16/139,792

(22) Filed: Sep. 24, 2018

(51) Int. Cl.
*H01Q 13/10* (2006.01)
*H01Q 21/00* (2006.01)
*H01Q 21/06* (2006.01)

(52) U.S. Cl.
CPC ......... *H01Q 21/0025* (2013.01); *H01Q 13/10* (2013.01); *H01Q 21/064* (2013.01)

(58) Field of Classification Search
CPC ... H01G 21/0025; H01G 13/10; H01G 21/064
See application file for complete search history.

(56) References Cited

U.S. PATENT DOCUMENTS

| 5,162,756 A | 11/1992 | Taniguchi et al. |
| 5,329,156 A | 7/1994 | Bartlow |
| 6,521,972 B1 | 2/2003 | Zhou et al. |
| 9,800,213 B1 | 10/2017 | Khalil et al. |
| 2002/0186091 A1 | 12/2002 | Maeda et al. |
| 2008/0150082 A1 | 6/2008 | Zupac et al. |
| 2011/0204976 A1 | 8/2011 | Masuda |
| 2016/0322942 A1 | 11/2016 | Lang et al. |

FOREIGN PATENT DOCUMENTS

| DE | 102008045240 A1 | 3/2009 |
| EP | 2197030 A2 | 9/2009 |
| EP | 2197030 A3 | 9/2009 |

*Primary Examiner* — Graham P Smith
(74) *Attorney, Agent, or Firm* — Charlene R. Jacobsen

(57) ABSTRACT

A feed structure for an electrical component includes a slot structure with first and second longitudinal sections opposing one another and first and second interconnect segments opposing one another. The first and second interconnect segments couple the first longitudinal section with the second longitudinal section to form an opening extending through the slot structure, the opening being surrounded by the first longitudinal section, the first interconnect segment, the second longitudinal section, and the second interconnect segment. A first feed node is electrically connected to the slot structure at an intermediate region between first and second ends of the first longitudinal section, and second feed nodes are electrically coupled to the slot structure along the second longitudinal section. In a device or module, the second feed nodes are configured for electrical connection to the electrical component.

20 Claims, 4 Drawing Sheets

PRIOR ART

FEED STRUCTURE, ELECTRICAL COMPONENT INCLUDING THE FEED STRUCTURE, AND MODULE

TECHNICAL FIELD OF THE INVENTION

The present invention relates generally to electrical components. More specifically, the present invention relates to an input/output feed structure for a transistor, with substantially uniform feed of power to or from transistor elements of the transistor.

BACKGROUND OF THE INVENTION

Power transistor devices for radio frequency (RF) high power devices are typically made of multiple building blocks, sometimes referred to as unit cells or individual transistors which are driven in parallel with the outputs of the transistors combined as the power output. Especially at higher frequencies, where the wavelength is small compared to the mechanical dimension and the quantity of unit cells, then evenly feeding power to transistor elements or combining power from transistor elements of such devices is not straightforward. That is, an uneven power distribution to the transistor elements may potentially reduce the performance and lifetime of such transistors.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a feed structure for an electrical component, a transistor structure including the feed structure, and a module that includes an electrical component and the feed structure. More specifically, embodiments of a feed structure implemented with an electrical component, a transistor structure and/or a module reduces a phase difference between the feed nodes of the feed structure to enable the even distribution of power to elements of the electrical component and/or to enable effective power combining of power from the elements of the electrical component. The reduction in phase difference and even distribution of power may enhance electrical performance, thermal distribution, and lifetime. Further, the feed structure is compact which can be beneficial for small form factor designs. The feed structure may be part of a transistor input/output or inter-stage matching network. Additionally, the feed structure be implemented with a wide variety of electrical components such as integrated circuits, distributed antenna systems, filters, an array of passive components or any other configuration requiring power dividing and/or power combining.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
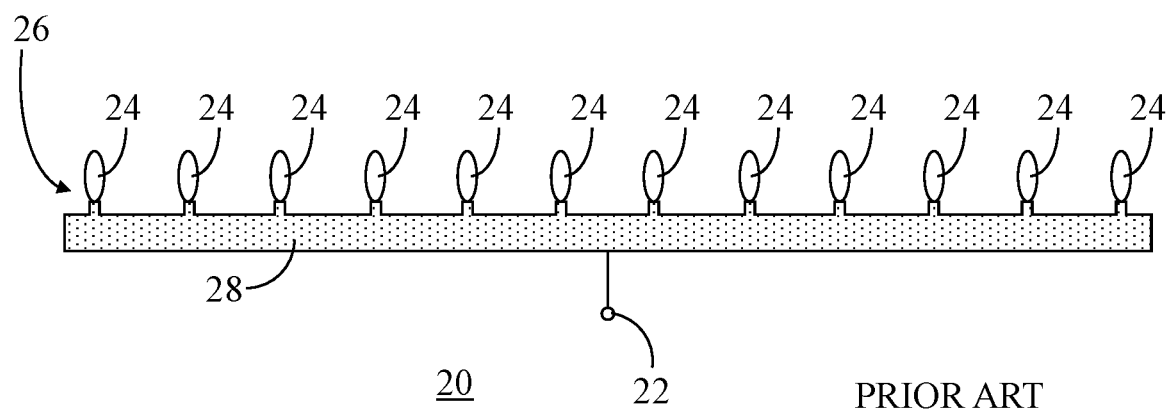
FIG. 1 shows a schematic representation of a prior art feed structure.

FIG. 1 shows a schematic representation of a prior art feed structure 20. In feed structure 20, an input signal is applied at a feed node 22 and is distributed to, for example, transistor elements 24 of a transistor structure 26 via an electrically conductive feed path 28. An output side of transistor structure 26 may be "power combined" by the same feed structure 20 in reverse order.

In the simple manifold configuration of prior art feed structure 20, there may be a phase difference of the input signal at the excitation nodes of transistor elements 24 farthest from feed node 22 relative to the excitation nodes of transistor elements 24 closest to feed node 22. In particular, a power divider ratio can be adversely influenced by distributed effects, which leads to uneven power distribution and phase differences of the input signal between transistor elements 24. As such, transistor elements 24 of transistor 26 in the prior art feed structure 20 of FIG. 1 are not fed power equally which can degrade electrical performance, degrade thermal distribution, and reduce lifetime of transistor structure 26.

Figure 2:
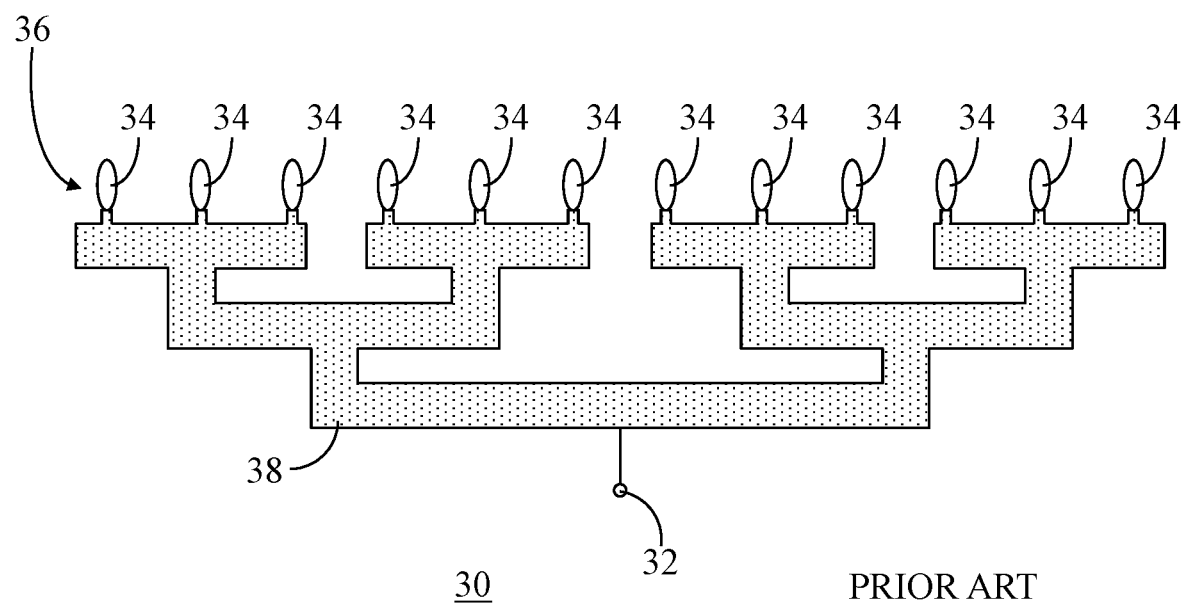
FIG. 2 shows a schematic representation of another feed structure in a fork or fishbone configuration.

FIG. 2 shows a schematic representation of another feed structure 30 in a fork or fishbone configuration. In feed structure 30, an input signal is applied at a feed node 32 and is distributed to, for example, transistor elements 34 of a transistor structure 36 via an electrically conductive feed path 38. Feed structure 30 is sometimes referred to as a "divide-by-two" feed. That is, feed path 38 is divided by two as many times as necessary to distribute the input signal from feed node 32 to input terminals of transistor elements 34. The "divide-by-two" pattern can be used several times, with generally each path having an equal input length to the input terminals of transistor elements 34. Again, an output side of transistor structure 36 may be "power combined" by the same feed structure 30 in reverse order.

Feed structure 30 may be implemented to adjust the phase mismatch and the uneven power distribution observed in prior art simple feed designs, such as feed structure 20 (FIG. 1). However, the fork or fishbone configuration of feed structure 30 is relatively large as compared to feed structure 20. Accordingly, the fork/fishbone configuration may not be practical for small form factor designs, especially at the input of a transistor structure.

Figure 3:
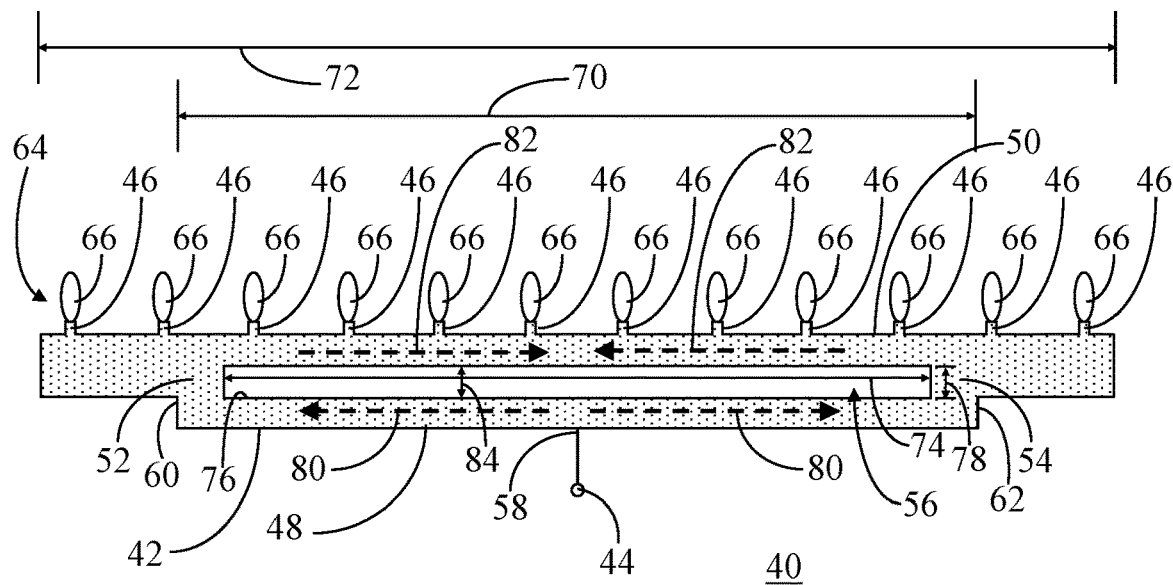
FIG. 3 shows a schematic representation of a feed structure in accordance with an embodiment.

Referring now to FIG. 3, FIG. 3 shows a schematic representation of a feed structure 40 in accordance with an embodiment. Feed structure 40 generally includes a slot structure 42, a first feed node 44, and second feed nodes 46. Slot structure 42 has first and second electrically conductive longitudinal sections 48, 50 opposing one another and first and second interconnect segments 52, 54 coupling first longitudinal section 48 to second longitudinal section 50. Thus, an opening 56 is formed extending through slot structure 42, with opening 56 being surrounded by first longitudinal section 48, first interconnect segment 52, second longitudinal section 50, and second interconnect segment 54.

First feed node 44 is electrically connected to slot structure 42 at an intermediate region between first and second ends 60, 62 of first longitudinal section 48. For example, the intermediate region may be a center point 58 between first and second ends 60, 62 of first longitudinal section 48 in some embodiments. Second feed nodes 46 are coupled to slot structure 42 along second longitudinal section 50 and may be evenly distributed along second longitudinal section 50. Second feed nodes 46 are configured for electrical connection to an electronical component, such as a transistor structure 64.

Transistor structure 64 represents a wide variety of unipolar (e.g., field effect transistors, FETs) and bipolar transistors (e.g., bipolar junction transistors, BJTs, and/or heterojunction bipolar transistors, HBTs). In the simplified schematic of FIG. 3, transistor structure 64 further represents a transistor structure having multiple interdigitated transistor fingers or a transistor structure having multiple individual transistors. In either instance, transistor structure 64 includes multiple transistor elements 66 (e.g., transistor fingers or individual transistors). Transistor elements 66 of transistor structure 64 are generally represented by ovals in FIG. 3 to denote that they may be individual transistor fingers or individual transistors.

Feed structure 40 will be described herein as an input feed structure. Accordingly, an input signal is applied at feed node 44 and the input signal is provided to transistor elements 66 via an electrically conductive feed path that includes slot structure 42 and second feed nodes 46. When transistor structure 64 is a field effect transistor (FET) configuration, transistor elements 66 may be gate fingers of an interdigitated transistor structure or the gate element of each individual transistor. When transistor structure 64 is a bipolar transistor configuration, transistor elements 66 may be base fingers of an interdigitated transistor structure or the base element of each individual transistor. Feed structure 40 may additionally be implemented at an output side of a transistor structure for power combining an output signal, as will be discussed below in connection with FIG. 5.

In some embodiments, first longitudinal section 48 exhibits a first total length 70 and second longitudinal section 50 exhibits a second total length 72 that may differ from first total length 70. In an example, second total length 72 of second longitudinal section 50 may be greater than first total length 70 to suitably accommodate second feed nodes 46 that may be evenly distributed along second longitudinal section 50.

Further, in some embodiments, first and second longitudinal sections 48, 50 exhibit a third length 74 at an inner perimeter 76 of opening 56 and first and second interconnect segments 52, 54 exhibit a fourth length 78 at inner perimeter 76 of opening 56. Further, fourth length 78 may be less than third length 74. Additionally, first and second longitudinal sections 48, 50 may be oriented parallel to one another, and first and second interconnect segments 52, 54 may be oriented parallel to one another and perpendicular to first and second longitudinal segments 52, 54. As such, opening 56 has a generally elongated rectangular slot configuration.

The location of first feed node 44 at center point 58 of first longitudinal section 48 results in current flow in opposing directions along first longitudinal section 48, as denoted by oppositely directed dashed lines 80 overlying first longitudinal section 48. Further, the current flow conducts through first and second interconnect segments 52, 54 to second longitudinal section 50. This current flow through second longitudinal section 50 is thus also in opposing directions along second longitudinal section 50, as denoted by oppositely directed dashed lines 82 overlying second longitudinal section 50. The oppositely directed dashed lines 80, 82 (representing the opposite flow of current) indicate interaction (e.g., mutual inductance) between first and second longitudinal sections 48, 50 of slot structure 42.

The amount of mutual inductance can be controlled by the dimensions of opening 56. For example, a width 84 of the generally elongated rectangular slot configuration of opening 56 extending between first and second longitudinal sections 48, 50 can be suitably configured to control the magnitude of mutual inductance between first and second longitudinal sections 48, 50 due to the oppositely directed current flow. This mutual inductance can result in a substantially uniform distribution of power to each of second feed nodes 46 and therefore to transistor elements 66.

However, the mutual inductance produced via slot structure 42 of feed structure 40 may generate significant power losses under some conditions. For example, a narrow width 84 increases the mutual inductance between first and second longitudinal sections 48, 50 relative a greater width 84 of opening 56. Unwanted mutual inductance can be a primary contributor of losses in highly integrated designs. These losses may be particularly problematic when feed structure 40 is implemented as an output feed structure. Accordingly, width 84 can be suitably selected as a compromise that yields mutual inductance (e.g., coupling) albeit at a lower magnitude, with an acceptably low level of signal loss.

Thus, the dimensions of opening 56 may be suitably designed to compensate for the phase differences of the input signal at the second feed nodes 46 in order to significantly decrease the phase difference relative to the prior art simple feed structure 20 (FIG. 1) while yielding a low loss design. Still further, feed structure 40 with slot structure 42 yields a more compact configuration as opposed to the fork/fishbone configuration of feed structure 30 (FIG. 2).

Feed structure 40 and alternative embodiments of a feed structure (described below) are discussed herein as interconnecting with a transistor structure. However, it should be understood that a feed structure in accordance with some embodiments may be implemented with a wide variety of electrical components such as integrated circuits, distributed antenna systems, filters, an array of passive components or any other configuration requiring power dividing and/or power combining.

Figure 4:
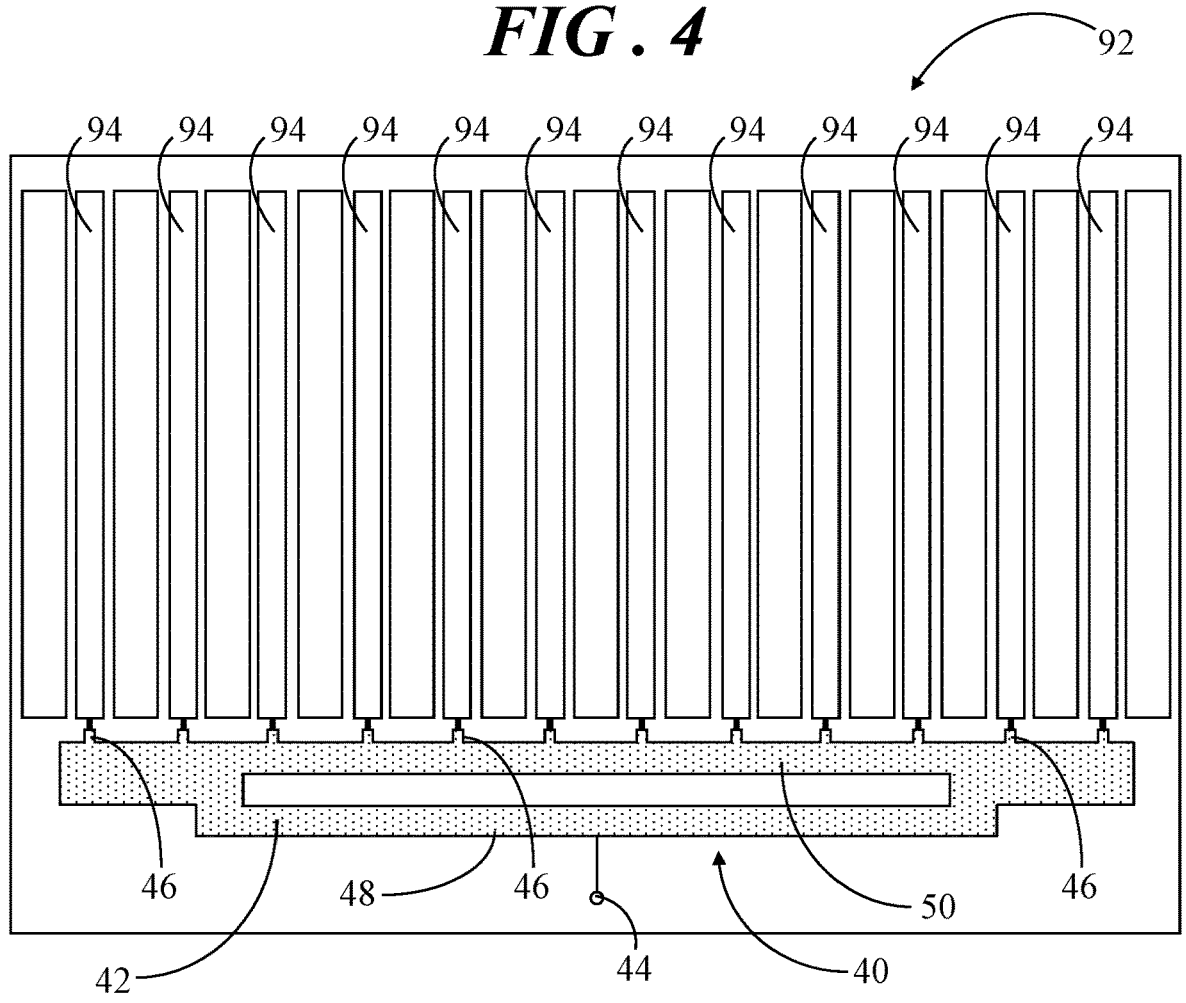
FIG. 4 shows a schematic representation of a device that includes a transistor structure and the feed structure of FIG. 3.

FIG. 4 shows a schematic representation of a device 90 that includes a transistor structure 92 and feed structure 40. Transistor structure 92 represents a transistor layout with multiple interdigitated transistor elements, sometimes referred to as transistor fingers. When transistor structure 92 is a unipolar technology (e.g., FET), the transistor fingers are typically referred to as gate, source, and drain fingers and when transistor structure 92 is a bipolar technology (e.g., BJT, HBT), the transistor fingers are typically referred to as base, collector, and source fingers.

Second feed nodes 46 of feed structure 40 are electrically connected to transistor structure 92. More particularly, one each of second feed nodes 46 is coupled to one each of multiple transistor elements, referred to herein as transistor fingers 94, of transistor structure 92. When feed structure 40 is implemented as an input feed, transistor fingers 94 may be input elements (e.g., gate or base fingers) of transistor structure 92. Accordingly, an input signal may be provided from first feed node 44 via slot structure 42 and second feed nodes 46 to each of transistor fingers 94. Again, the configuration of feed structure 40 enables mutual inductance between first and second longitudinal sections 48, 50 that results in a substantially uniform feed of power to each of second feed nodes 46 and, hence, uniform consumption of power at each of transistor fingers 94. Transistor fingers 94 (e.g., gate or base fingers) of transistor structure 92 are discussed herein in connection with feed structure 40 for illustrative purposes. It should be understood, however, that additional feed structures 40 may be electrically connected to other transistor fingers of transistor structure 92 (e.g., drain/collector fingers). The various other details of a transistor structure are known to those skilled in the art and are therefore not described herein for brevity.

Figure 5:
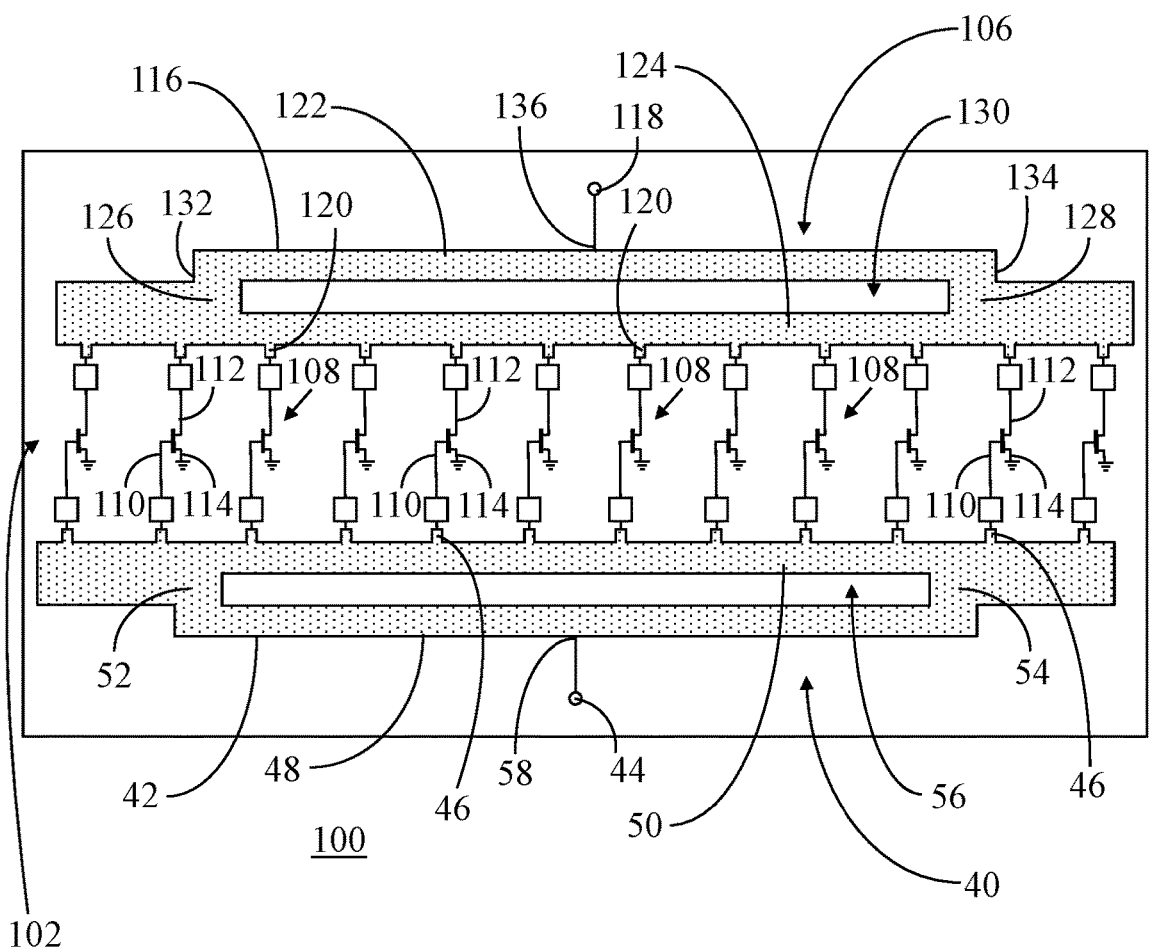
FIG. 5 shows a schematic representation of a module that includes an electrical component and two feed structures.

FIG. 5 shows a schematic representation of a module 100 that includes an electrical component in the form of a transistor structure 102, feed structure 40, and a second feed structure 106 in accordance with another embodiment. Module 100 may be, for example, a portion of a high frequency (e.g., 3.5 GHz, 4.8 GHz) amplifier module. In the illustrated example, transistor structure 102 represents a transistor layout with multiple individual transistors 108. In other embodiments, the multiple individual transistors 108 may alternatively be transistor fingers of a single transistor or unit cell such as that described above in FIG. 4. When transistor structure 102 is a unipolar technology (e.g., FET), transistor elements of each of transistors 108 include gate, source, and drain elements and when transistor structure 102 is a bipolar technology (e.g., BJT, HBT), transistor elements of each of transistors 108 include base, collector, and source elements. For simplicity of discussion, transistor structure 102 implements a bipolar technology. Thus, each of transistors 108 includes transistor elements in the form of a base element 110, a collector element 112, and a source element 114.

As discussed in detail in connection with FIG. 3, feed structure 40 (referred to in connection with FIG. 5 as a first feed structure 40), includes slot structure 42, first feed node 44, and second feed nodes 46. Slot structure 42 has opening 56 extending through slot structure 42, with opening 56 being surrounded by first longitudinal section 48, first interconnect segment 52, second longitudinal section 50, and second interconnect segment 54. Again, first feed node 44 is electrically connected to slot structure 42 at center point 58 of first longitudinal section 48 and second feed nodes 46 are coupled to slot structure 42 along second longitudinal section 50.

In the illustrated configuration of FIG. 5, second feed nodes 46 are configured for electrical connection to individual transistors 108 of transistor structure 102. More particularly, one of second feed nodes 46 is coupled each base element 110 of each individual transistor 108. Thus, an input signal may be provided from first feed node 44 via slot structure 42 to each of base elements 110. Again, the configuration of feed structure 40 enables mutual inductance between first and second longitudinal sections 48, 50 that results in a substantially uniform feed of power to each of second feed nodes 46 and, hence, to each of base elements 110.

Second feed structure 106 is similar to first feed structure 40. Thus, second feed structure 106 includes a second slot structure 116, a third feed node 118, and fourth feed nodes 120. Second slot structure 116 has third and fourth electrically conductive longitudinal sections 122, 124 opposing one another and third and fourth interconnect segments 126, 128 coupling third longitudinal section 122 to fourth longitudinal section 124. Thus, an opening 130 is formed extending through second slot structure 116, with opening 130 being surrounded by third longitudinal section 122, third interconnect segment 126, fourth longitudinal section 124, and fourth interconnect segment 128.

Third feed node 118 is electrically connected to second slot structure 116 at an intermediate region between third and fourth ends 132, 134 of third longitudinal section 122. For example, the intermediate region may be a center point 136 of third longitudinal section 122 between first and second ends 132, 134 in some embodiments. Fourth feed nodes 120 are coupled to second slot structure 116 along fourth longitudinal section 124.

In the illustrated configuration of FIG. 5, fourth feed nodes 120 are configured for electrical connection to individual transistors 108 of transistor structure 102. More particularly, one of fourth feed nodes 120 is coupled each collector element 112 of each individual transistor 108. Thus, an output signal may be received from each collector element 112 via fourth feed nodes 120. The output signal from each collector element 112 is combined via second slot structure 116 for output at third feed node 118. Thus, second feed structure 106 is implemented at an output side of transistor structure 102 as an output feed structure for power combining the output signals from transistors 108 of transistor structure 102. The configuration of feed structure 106 enables mutual inductance between first and second longitudinal sections 48, 50 that results in substantially uniform power combining from each of second feed nodes 46 and, hence, from each of collector elements 112.

Figure 6:
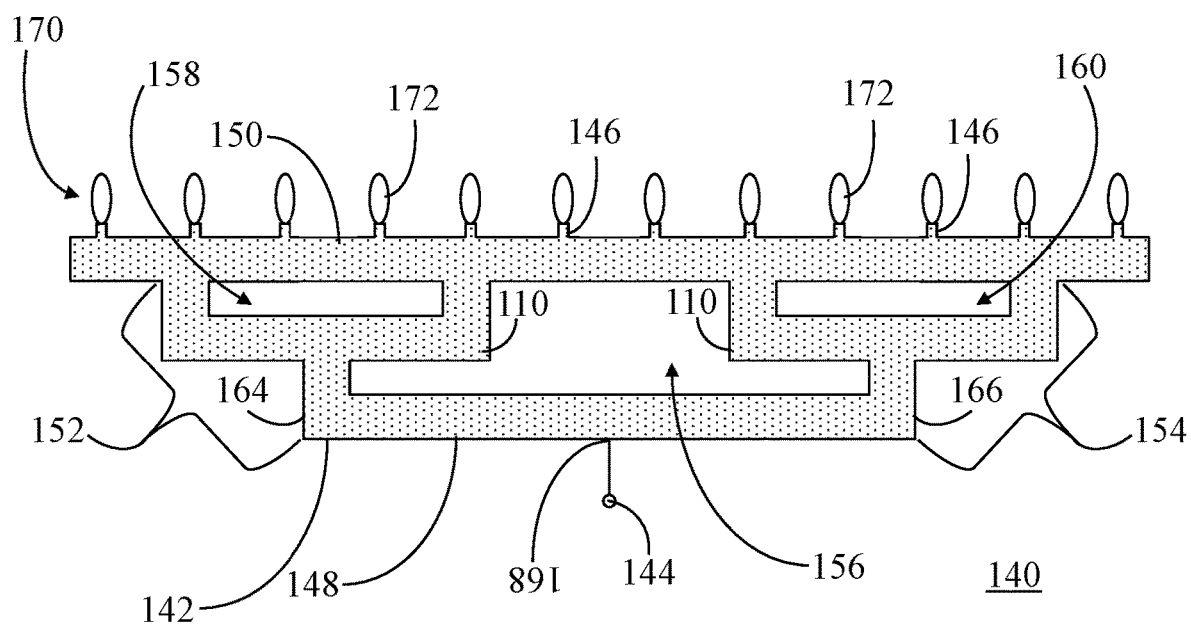
FIG. 6 shows a schematic representation of a feed structure in accordance with another embodiment.

Referring now to FIG. 6, FIG. 6 shows a schematic representation of a feed structure 140 in accordance with another embodiment. Feed structure 140 generally includes a slot structure 142, a first feed node 144, and second feed nodes 146. Slot structure 142 has first and second electrically conductive longitudinal sections 148, 150 opposing one another and first and second interconnect segments 152, 154 coupling first longitudinal section 148 to second longitudinal section 150. A first opening 156 is formed extending through slot structure 142 with first opening 156 being surrounded by first longitudinal section 148, first interconnect segment 152, second longitudinal section 150, and second interconnect segment 154. Slot structure 142 further includes additional openings 158, 160 extending through slot structure 142 between first and second longitudinal sections 148, 150. Openings 158, 160 are physically isolated from first opening 156 and one another by additional segments 162 of slot structure 142.

First feed node 144 is electrically connected to slot structure 142 at an intermediate region between first and second ends 164, 166 of first longitudinal section 148. For example, the intermediate region may be a center point 168 of first longitudinal section 148 between first and second ends 164, 166 in some embodiments. Second feed nodes 146 are coupled to slot structure 142 along second longitudinal section 150 and may be evenly distributed along second longitudinal section 150. Second feed nodes 146 are configured for electrical connection to transistor elements 172 of a transistor structure 170.

Figure 7:
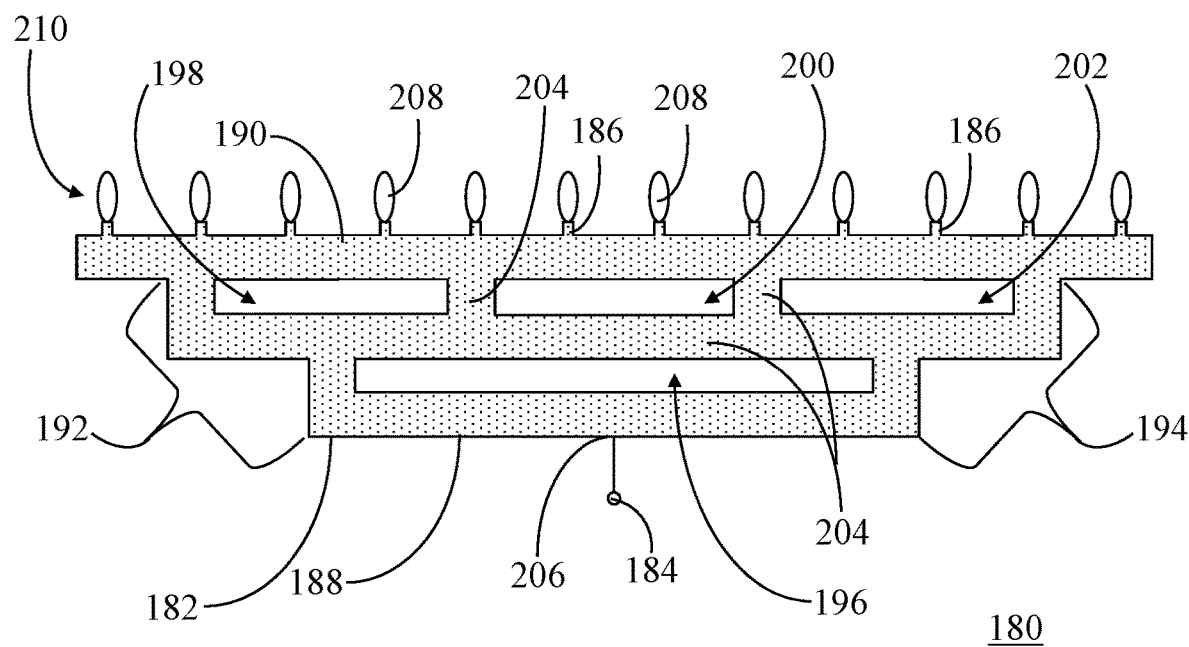
FIG. 7 shows a schematic representation of a feed structure in accordance with another embodiment.

FIG. 7 shows a schematic representation of a feed structure 180 in accordance with another embodiment. Feed structure 180 generally includes a slot structure 182, a first feed node 184, and second feed nodes 186. Slot structure 182 has first and second electrically conductive longitudinal sections 188, 190 opposing one another and first and second interconnect segments 192, 194 coupling first longitudinal section 188 to second longitudinal section 190. A first opening 196 is formed extending through slot structure 182 with first opening 196 being surrounded by first longitudinal section 188, first interconnect segment 192, second longitudinal section 190, and second interconnect segment 194. Slot structure 182 further includes additional openings 198, 200, 202 extending through slot structure 182 between first and second longitudinal sections 188, 190. Openings 198, 200, 202 are physically isolated from first opening 196 and one another by additional segments 204 of slot structure 182. First feed node 184 may be electrically connected to slot structure 182 at a center point 206 of first longitudinal section 188 in some embodiments. Second feed nodes 186 are coupled to slot structure 182 along second longitudinal section 190. Second feed nodes 186 are configured for electrical connection to transistor elements 208 (represented by ovals) of a transistor structure 210.

Feed structure 140 (FIG. 7) and feed structure 180 represent configurations with multiple openings extending through a slot structure. Further, feed structure 140 represents a configuration in which an opening is characterized by a step-wise non-rectangular shape. Either of feed structures 140, 180 may be useful as an output feed structure to reduce the phase and yield effective power combining, while minimizing losses. However, feed structures 140, 180 may not achieve the size benefits of feed structures 40, 106.

Figure 8:
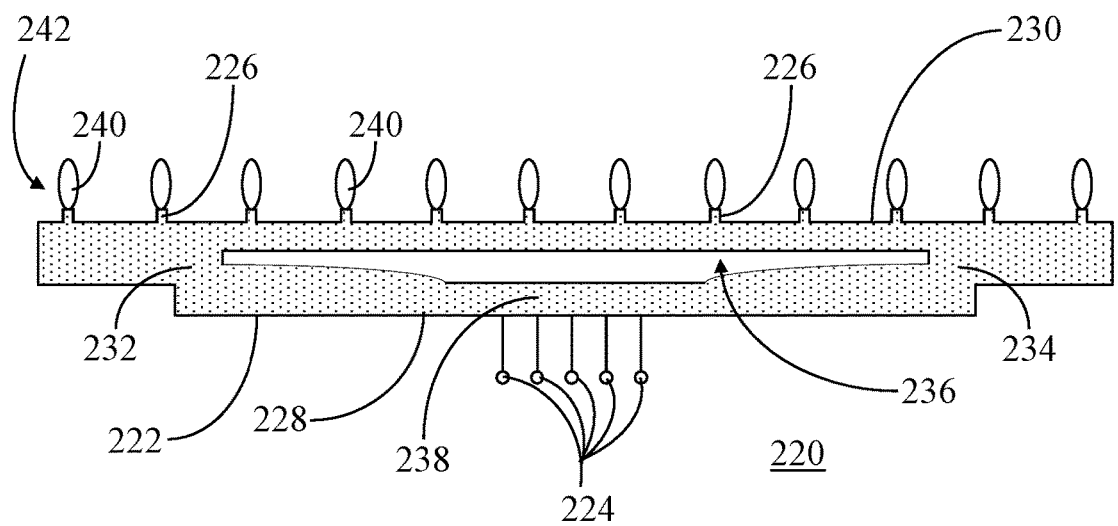
FIG. 8 shows a schematic representation of a feed structure in accordance with another embodiment.

FIG. 8 shows a schematic representation of a feed structure 220 in accordance with another embodiment. Feed structure 220 generally includes a slot structure 222, multiple first feed nodes 224, and multiple second feed nodes 226. Slot structure 222 has first and second electrically conductive longitudinal sections 228, 230 opposing one another and first and second interconnect segments 232, 234 coupling first longitudinal section 228 to second longitudinal section 230. An opening 236 is formed extending through slot structure 222 with opening 236 being surrounded by first longitudinal section 228, first interconnect segment 232, second longitudinal section 230, and second interconnect segment 234.

First feed nodes 224 may be electrically connected to slot structure 222 at an intermediate region 238 of first longitudinal section 228 in some embodiments. Second feed nodes 226 are coupled to slot structure 222 along second longitudinal section 230. In this illustrated configuration second feed nodes 226 are configured for electrical connection to elements 240 (represented by ovals) of an electronic component 242.

Feed structure 210 again provides an example of a configuration in which the shape of an opening extending through slot structure 212 need not be an oblong rectangle. Instead, opening 226 is characterized by a non-rectangular shape. Further, feed structure 210 provides an example in which there may be multiple first feed nodes 214 along with multiple second feed nodes 216. That is, feed structure 220 may include multiple input and output nodes, as exemplified by first and second feed nodes 214, 216.

Various feed structure configurations are described above having one or more slotted openings that may be an oblong rectangle or a non-rectangular shape. However, it should be understood that feed structures that include one or more openings of differing shapes, sizes, and widths may alternatively be envisioned for providing an even distribution of power to/from transistor elements of a transistor structure and minimizing losses, while yielding a compact form factor. Further, the feed structures were shown with twelve feed nodes for electrical coupling to transistor elements. It should be understood that feed structures in accordance with embodiments described herein can have more or less than the illustrated quantity of feed nodes.

Embodiments described herein entail a feed structure for an electrical component, a transistor structure including the feed structure, and a module that includes an electrical component and the feed structure. An embodiment of a feed structure for an electrical component comprises a slot structure including first and second electrically conductive longitudinal sections opposing one another and first and second electrically conductive interconnect segments opposing one another. The first and second interconnect segments couple the first longitudinal section to the second longitudinal section to form an opening extending through the slot structure, the opening being surrounded by the first longitudinal section, the first interconnect segment, the second longitudinal section, and the second interconnect segment. The feed structure further comprises a first feed node electrically connected to the slot structure at an intermediate region between first and second ends of the first longitudinal section and second feed nodes electrically coupled to the slot structure along the second longitudinal section, the second feed nodes being configured for electrical connection to the electrical component.

An embodiment of a device comprises a transistor structure having transistor elements and a feed structure. The feed structure comprises a slot structure including first and second electrically conductive longitudinal sections opposing one another and first and second electrically conductive interconnect segments opposing one another, the first and second interconnect segments coupling the first longitudinal section to the second longitudinal section to form an opening extending through the slot structure, the opening being surrounded by the first longitudinal section, the first interconnect segment, the second longitudinal section, and the second interconnect segment. The feed structure further comprises a first feed node electrically connected to the slot structure at an intermediate region between first and second ends of the first longitudinal section and second feed nodes electrically coupled to the slot structure along the second longitudinal section, one each of the second feed nodes being coupled to one each of the transistor elements.

An embodiment of a module comprises an electrical component having first and second elements, a first feed structure, and a second feed structure. The first feed structure comprises a first slot structure including first and second electrically conductive longitudinal sections opposing one another and first and second electrically conductive interconnect segments opposing one another, the first and second interconnect segments coupling the first longitudinal section to the second longitudinal section to form a first opening extending through the first slot structure, the first opening being surrounded by the first longitudinal section, the first interconnect segment, the second longitudinal section, and the second interconnect segment, wherein the first and second longitudinal sections exhibit a first length at an inner perimeter of the opening, and the first and second interconnect segments exhibit a second length at the inner perimeter of the opening, the second length being less than the first length. The first feed structure further comprises a first feed node electrically connected to the first slot structure at a first intermediate region between first and second ends of the first longitudinal section and second feed nodes electrically coupled to the first slot structure along the second longitudinal section, one each of the second feed nodes being coupled to one each of the first element of the electrical component. The second feed structure comprises a second slot structure including third and fourth electrically conductive longitudinal sections opposing one another and third and fourth electrically conductive interconnect segments opposing one another, the third and fourth interconnect segments coupling the first longitudinal section to the second longitudinal section to form a second opening extending through the second slot structure, the second opening being surrounded by the third longitudinal section, the third interconnect segment, the fourth longitudinal section, and the fourth interconnect segment. The second feed structure further comprises a third feed node electrically connected to the second slot structure at a second intermediate region between third and fourth ends of the third longitudinal section and fourth feed nodes electrically coupled to the second slot structure along the fourth longitudinal section, one each of the fourth feed nodes being coupled to one each of the second elements of the electrical component.

Accordingly, embodiments can include a feed structure having a slot structure that enables the even distribution of power to the transistor elements of a transistor structure and effective combining of power from the transistor elements of a transistor structure. The even distribution of power may enhance electrical performance, thermal distribution, and lifetime. Further, the feed structure is compact which can be beneficial for small form factor designs. The feed structure may be part of a transistor input/output or inter-stage matching network.

More specifically, embodiments of a feed structure implemented with an electrical component, a transistor structure and/or a module reduces a phase difference between the feed nodes of the feed structure to enable the even distribution of power to elements of the electrical component and/or to enable effective power combining of power from the elements of the electrical component. The reduction in phase difference and even distribution of power may enhance electrical performance, thermal distribution, and lifetime. Further, the feed structure is compact which can be beneficial for small form factor designs. The feed structure may be part of a transistor input/output or inter-stage matching network. Additionally, the feed structure be implemented with a wide variety of electrical components such as integrated circuits, distributed antenna systems, filters, an array of passive components or any other configuration requiring power dividing and/or power combining.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A feed structure for electrical component comprising:
    a slot structure including first and second electrically conductive longitudinal sections opposing one another and first and second electrically conductive interconnect segments opposing one another, the first and second interconnect segments coupling the first longitudinal section to the second longitudinal section to form an opening extending through the slot structure, the opening being surrounded by the first longitudinal section, the first interconnect segment, the second longitudinal section, and the second interconnect segment;
    a first feed node electrically connected to the slot structure at an intermediate region between first and second ends of the first longitudinal section; and
    second feed nodes electrically coupled to the slot structure along the second longitudinal section, the second feed nodes being configured for electrical connection to the electrical component.

2. The feed structure of claim 1 wherein the electrical component includes input elements, and one each of the second feed nodes is configured to be coupled to one each of the input elements for providing an input signal from the first feed node via the slot structure to each of the input elements.

3. The feed structure of claim 1 wherein the electrical component includes output elements, and one each of the second feed nodes is configured to be coupled to one each of the output elements for receiving an output signal from each of the output elements for output at the first feed node.

4. The feed structure of claim 1 wherein the first and second longitudinal sections exhibit a first length at an inner perimeter of the opening, and the first and second interconnect segments exhibit a second length at the inner perimeter of the opening, the second length being less than the first length such that the opening is characterized by an oblong rectangular shape.

5. The feed structure of claim 1 wherein the opening is characterized by a non-rectangular shape.

6. The feed structure of claim 1 wherein:
    the first longitudinal section is characterized by a first length; and
    the second longitudinal section is characterized by a second length that differs from the first length.

7. The feed structure of claim 1 wherein the second feed nodes are evenly distributed along a length of the second longitudinal section.

8. The feed structure of claim 1 wherein the first feed node is electrically connected to the slot structure at a center point between first and second ends of the first longitudinal section.

9. The feed structure of claim 1 further comprising multiple first feed nodes electrically connected to the first longitudinal section of the slot structure.

10. The feed structure of claim 1 wherein the opening is characterized by a width extending between the first and second longitudinal sections, the width being configured to enable mutual inductance between the first and second longitudinal sections that results in a substantially uniform feed of power to or from each of the second feed nodes.

11. The feed structure of claim 1 wherein the opening is a first opening, and the slot structure further comprises at least one additional opening extending through the slot structure between the first and second longitudinal sections, the at least one additional opening being physically isolated from the first opening by additional segments of the slot structure.

12. The feed structure of claim 1 wherein the electrical component is a transistor structure.

13. A device comprising:
a transistor structure having transistor elements; and
a feed structure comprising:
   a slot structure including first and second electrically conductive longitudinal sections opposing one another and first and second electrically conductive interconnect segments opposing one another, the first and second interconnect segments coupling the first longitudinal section to the second longitudinal section to form an opening extending through the slot structure, the opening being surrounded by the first longitudinal section, the first interconnect segment, the second longitudinal section, and the second interconnect segment;
   a first feed node electrically connected to the slot structure at an intermediate region between first and second ends of the first longitudinal section; and
   second feed nodes electrically coupled to the slot structure along the second longitudinal section, one each of the second feed nodes being coupled to one each of the transistor elements.

14. The device of claim 13 wherein each of the second feed nodes is configured to provide an input signal from the first feed node via the slot structure to each of the transistor elements.

15. The device of claim 13 wherein each of the second feed nodes is configured to receive an output signal from each of the transistor elements for output at the first feed node.

16. The device of claim 13 wherein the opening is characterized by a width extending between the first and second longitudinal sections, the width being configured to enable mutual inductance between the first and second longitudinal sections that results in a substantially uniform feed of power to or from each of the second feed nodes.

17. The device of claim 13 wherein the first and second longitudinal sections exhibit a first length at an inner perimeter of the opening, and the first and second interconnect segments exhibit a second length at the inner perimeter of the opening, the second length being less than the first length.

18. A module comprising:
an electrical component having first and second elements;
a first feed structure comprising:
   a first slot structure including first and second electrically conductive longitudinal sections opposing one another and first and second electrically conductive interconnect segments opposing one another, the first and second interconnect segments coupling the first longitudinal section to the second longitudinal section to form a first opening extending through the first slot structure, the first opening being surrounded by the first longitudinal section, the first interconnect segment, the second longitudinal section, and the second interconnect segment, wherein the first and second longitudinal sections exhibit a first length at an inner perimeter of the first opening, and the first and second interconnect segments exhibit a second length at the inner perimeter of the opening, the second length being less than the first length;
   a first feed node electrically connected to the first slot structure at a first intermediate region between first and second ends of the first longitudinal section; and
   second feed nodes electrically coupled to the first slot structure along the second longitudinal section, one each of the second feed nodes being coupled to one each of the first elements of the electrical component; and
a second feed structure comprising:
   a second slot structure including third and fourth electrically conductive longitudinal sections opposing one another and third and fourth electrically conductive interconnect segments opposing one another, the third and fourth interconnect segments coupling the third longitudinal section to the fourth longitudinal section to form a second opening extending through the second slot structure, the second opening being surrounded by the third longitudinal section, the third interconnect segment, the fourth longitudinal section, and the fourth interconnect segment;
   a third feed node electrically connected to the second slot structure at a second intermediate region between third and fourth ends of the third longitudinal section; and
   fourth feed nodes electrically coupled to the second slot structure along the fourth longitudinal section, one each of the fourth feed nodes being coupled to one each of the second elements of the electrical component.

19. The module of claim 18 wherein:
each of the second feed nodes is configured to provide an input signal from the first feed node via the first slot structure to each of the first elements; and
each of the fourth feed nodes is configured receive an output signal from each of the second elements for output at the third feed node.

20. The module of claim 18 wherein the electrical component comprises a transistor structure, and the first and second elements are first and second transistor elements.

* * * * *